United States Patent
Liu

(10) Patent No.: US 9,978,677 B2
(45) Date of Patent: May 22, 2018

(54) CONTACT VIA STRUCTURE AND FABRICATING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Ji Quan Liu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days. days.

(21) Appl. No.: 15/333,319

(22) Filed: Oct. 25, 2016

(65) Prior Publication Data

US 2017/0117218 A1    Apr. 27, 2017

(30) Foreign Application Priority Data

Oct. 26, 2015 (CN) .......................... 2015 1 0703687

(51) Int. Cl.
*H01L 21/00* (2006.01)
*H01L 23/522* (2006.01)
(Continued)

(52) U.S. Cl.
CPC .... *H01L 23/5226* (2013.01); *H01L 21/76804* (2013.01); *H01L 21/76814* (2013.01);
(Continued)

(58) Field of Classification Search
CPC .......... H01L 23/5226; H01L 21/76844; H01L 21/76814; H01L 21/76843;
(Continued)

(56) References Cited

U.S. PATENT DOCUMENTS

2002/0148487 A1    10/2002    Wu et al.
2003/0216037 A1    11/2003    Zhang et al.
(Continued)

FOREIGN PATENT DOCUMENTS

JP    H09213801 A    8/1997
JP    2006165189 A    6/2006
WO    2008025676 A1    3/2008

OTHER PUBLICATIONS

The European Patent Office (EPO) The Extended European Search Report for 16194579.5 dated Jul. 24, 2017 18 Pages.

*Primary Examiner* — Thanh Y Tran
(74) *Attorney, Agent, or Firm* — Anova Law Group, PLLC

(57) ABSTRACT

In some embodiments, a contact via and a fabricating method thereof are provided. The method can comprise: providing a substrate; forming a buffer layer in the substrate; forming a dielectric layer covering the substrate and the buffer layer; forming a through hole in the dielectric layer, wherein a bottom of the through hole exposes a surface of the buffer layer; performing a roughening treatment to the exposed surface of the buffer layer to increase a roughness of the exposed surface of the buffer layer; forming a barrier layer in the through hole, and reducing a thickness of a portion of the barrier layer at the bottom of the through hole; and filling a conductive material into the through hole to form a contact via.

20 Claims, 6 Drawing Sheets

(51) Int. Cl.
  *H01L 21/768* (2006.01)
  *H01L 23/528* (2006.01)
  *H01L 23/532* (2006.01)

(52) U.S. Cl.
  CPC .. *H01L 21/76826* (2013.01); *H01L 21/76843* (2013.01); *H01L 21/76844* (2013.01); *H01L 21/76883* (2013.01); *H01L 23/5283* (2013.01); *H01L 23/53295* (2013.01)

(58) Field of Classification Search
  CPC ......... H01L 23/53295; H01L 21/76804; H01L 21/76883; H01L 21/76826; H01L 23/5283
  See application file for complete search history.

(56) References Cited

U.S. PATENT DOCUMENTS

| | | |
|---|---|---|
| 2004/0005775 A1 | 1/2004 | Chou et al. |
| 2005/0048767 A1 | 3/2005 | Matsumoto |
| 2006/0099786 A1 | 5/2006 | Fan et al. |
| 2006/0276031 A1 | 12/2006 | Nam |
| 2008/0122090 A1* | 5/2008 | Hsu ................. H01L 21/76814 257/746 |
| 2011/0127158 A1 | 6/2011 | Hamaya et al. |

* cited by examiner

CONTACT VIA STRUCTURE AND FABRICATING METHOD THEREOF

CROSS-REFERENCES TO RELATED APPLICATIONS

This application claims the priority of Chinese patent application No. 201510703687.X, filed on Oct. 26, 2015, the entire content of which is incorporated herein by reference.

TECHNICAL FIELD

The present disclosure generally relates to the field of semiconductor technologies and, more particularly, relates to a contact via structure and a method for fabricating the contact via structure.

BACKGROUND

In existing integrated circuits, an interconnection between an upper layer and a lower layer can be generally achieved by using one or more contact vias. A specific process for forming a contact via can include the following steps. Firstly, a dielectric layer can be deposited. Then, a through hole can be formed in the dielectric layer by using photolithography technique and an etching process. Next, a barrier layer and a seed layer can be sequentially formed by using a physical vapor deposition (PVD) process. Then the through hole can be filled by using an electro chemical plating (ECP) method. Finally, a top surface of the filled through hole can be planarized by using a chemical mechanical polishing (CMP) method.

However, during the deposition process for forming the barrier layer, a portion of the barrier layer can be deposited on the bottom of the through hole, which can increase the resistance of the contact via. Accordingly, it is desired to provide a method to reduce the resistance of the contact via.

BRIEF SUMMARY

In accordance with some embodiments of the disclosed subject matter, a contact via structure and a fabricating method thereof is provided.

One aspect of the disclosed subject matter provides a method for forming a contact via structure, comprising: providing a substrate; forming a buffer layer in the substrate; forming a dielectric layer covering the substrate and the buffer layer; forming a through hole in the dielectric layer, wherein a bottom of the through hole exposes a surface of the buffer layer; performing a roughening treatment to the exposed surface of the buffer layer to increase a roughness of the exposed surface of the buffer layer; and filling a conductive material into the through hole to form a contact via.

In some embodiments, the roughening treatment comprises: performing an oxidization process to the exposed surface of the buffer layer to form an oxidized layer; and removing the oxidized layer.

In some embodiments, the oxidization process comprises: using a hydrogen peroxide solution to oxidize the exposed surface of the buffer layer, wherein: a volume ratio of $H_2O$ and $H_2O_2$ in the hydrogen peroxide solution is in a range from 5:1 to 10:1; and a duration time of the oxidation process is in a range from 5 s to 20 s.

In some embodiments, removing the oxidized layer comprises: using a hydrofluoric acid solution to remove the oxide layer, wherein: a volume ratio of $H_2O$ and HF in the hydrofluoric acid solution is in a range from 50:1 to 5000:1; and a processing time of to apply the hydrofluoric acid solution is in a range from 5 s to 20 s.

In some embodiments, the roughening treatment comprises: performing an argon ion bombardment process to roughen the exposed surface of the buffer layer.

In some embodiments, the argon ion bombardment process comprises: an argon gas flow rate in a range from 4 sccm to 50 sccm; a radio frequency (RF) power applied to an RF coil in a range from 0.5 KW to 5 KW; an alternating current (AC) bias power applied to a wafer in a range from 200 W to 1000 W; and a duration time of the argon ion bombardment process in a range from 2 s to 15 s.

In some embodiments, the roughening treatment comprises: performing a dry etching process to roughen the exposed surface of the buffer layer.

In some embodiments, the dry etching process comprises: using $CClF_3$ or $CF_4$ as an etching agent having a duration time of the dry etching process in a range from 1 to 5 s.

In some embodiments, the method further comprises: before performing the roughening treatment, performing a cleaning process to remove by-products on the exposed surface of the buffer layer.

In some embodiments, a cleaning agent of the cleaning process is selected from HF solution, $H_2SO_4$ solution, HCl solution, $HNO_3$ solution, $NH_4OH$ solution, and a combination thereof.

In some embodiments, a cleaning agent of the cleaning process is HF solution; and a volume ratio of $H_2O$ and HF in the HF solution is in a range from 50:1 to 5000:1.

In some embodiments, the method further comprises: after performing the roughening treatment, forming a barrier layer in the through hole.

In some embodiments, forming the barrier layer comprises: using two physical vapor deposition (PVD) processes to form a tantalum nitride layer and a tantalum layer; wherein in each PVD process, a nitrogen flow rate is from 18 sccm to 30 sccm, an argon gas flow rate is from 4 sccm to 20 sccm, a DC power of physical bombardment is from 10 KW to 30 KW, and an AC bias power applied to a wafer is from 100 W to 1000 W.

In some embodiments, forming the barrier layer comprises: reducing a thickness of a portion of the barrier layer at the bottom of the through hole.

In some embodiments, reducing the thickness of the portion of the barrier layer at the bottom of the through hole comprises: performing an argon ion bombardment process to bombard the barrier layer at the bottom of the through hole; wherein an argon gas flow rate is in a range from 5 sccm to 50 sccm; an RF power applied on a RF coil is in a range from 10 kW to 30 kW to ionize the argon gas; an AC power applied on a wafer is in a range from 500 W to 1000 W to accelerate the argon ions; and a duration time of the argon ion bombardment process is in a range from 2 s to 15 s.

In some embodiments, the method further comprises: before filling the through hole, sequentially forming an adhesive layer and a seed layer on the barrier layer in the through hole; and after filling the through hole, performing a planarization process to planarize the top surface of the contact via.

Another aspect of the disclosed subject matter provides a contact via structure, comprising: a substrate; a buffer layer inside of the substrate; a dielectric layer covering the substrate and the buffer layer; a through hole in the dielectric layer, wherein a surface of the buffer layer at the bottom of the through hole is a roughened surface; a barrier layer in the through hole, wherein a thickness of one portion of the barrier layer at the bottom of the through hole is less than a thickness of another portion of the barrier layer on the sidewalls of the through hole; an adhesive layer on the barrier layer in the through hole; a seed layer on the adhesive layer in the through hole; and a conductive material filled in the through hole.

In some embodiments, the barrier layer comprises: a tantalum nitride layer and a tantalum layer, wherein a thickness of the tantalum nitride layer is in a range 20 Å to 50 Å; and a thickness of the tantalum layer is in a range 20 Å to 50 Å.

In some embodiments, a material of the dielectric layer is Black Diamond (BDII: SiOCH); a thickness of the dielectric layer is in a range from 1500 Å to 3000 Å; and a bonding force between the barrier layer and the buffer layer at the bottom of the through hole is less than a bonding force between the barrier layer and the dielectric layer at the side wall of the through hole.

In some embodiments, the through hole has a single damascene structure; an opening width of the through hole is in a range from 30 nm to 100 nm; and a depth of the through hole is in a range from 100 nm to 300 nm.

Other aspects of the disclosed subject matter can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

Figure 1:
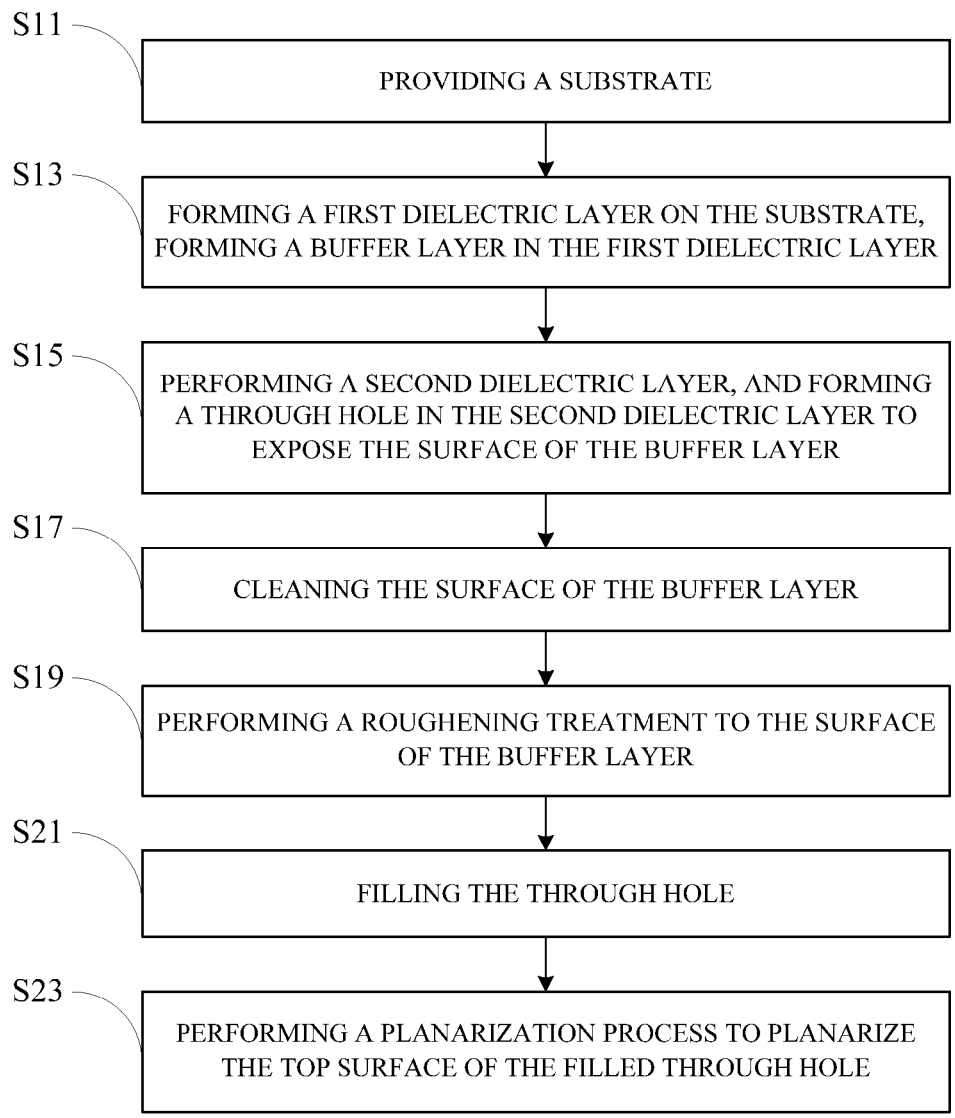
FIG. 1 illustrates a flow chart of an exemplary process for fabricating a contact via in accordance with some embodiments of the disclosed subject matter.

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of one disclosure.

It is apparent that the described embodiments are some but not all of the embodiments of the present invention. Based on the disclosed embodiments, persons of ordinary skill in the art may derive other embodiments consistent with the present disclosure, all of which are within the scope of the present invention.

The disclosed subject matter provides a contact via structure and a fabricating method thereof. In the following, details of the contact via and the fabricating method are described in connection with the drawings.

Note that, a contact via having a single damascene structure is described herein as an example. However, the disclosed fabricating method can be applied to any other contact vias having different suitable structures, such as a plug structure, a straight through-hole structure, etc.

Turning to FIG. 1, a flow chart of an exemplary process for fabricating a contact via is shown in accordance with some embodiments of the disclosed subject matter.

Figure 4:
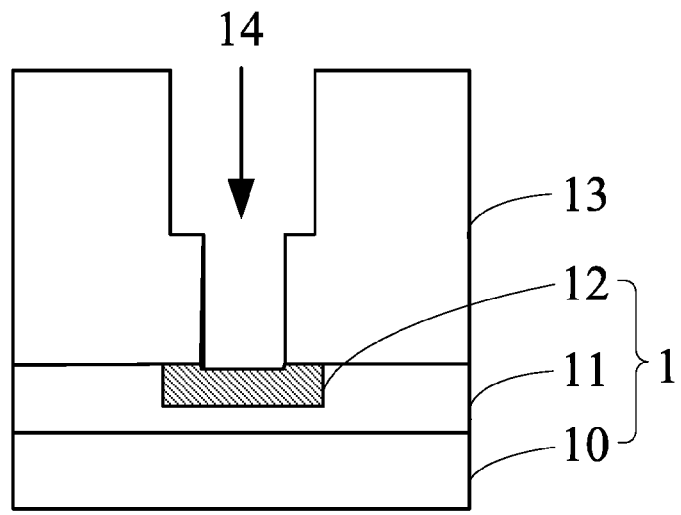
FIGS. 4-12 illustrate cross sectional structures of an exemplary contact via corresponding to certain stages of an exemplary fabricating process consistent with some embodiments of the disclosed subject matter.

Referring to step 11 in FIG. 1 and as illustrated in FIG. 4, a semiconductor substrate 10 can be provided.

In some embodiments, a material of the semiconductor substrate 10 may be silicon or polycrystalline silicon. In some other embodiments, a material of the semiconductor substrate 10 can be selected from silicon, germanium, gallium arsenide and silicon germanium compound, or any other suitable semiconductor material. The semiconductor substrate 10 may have an epitaxial layer, or have a silicon on an epitaxial layer. In some embodiments, the semiconductor substrate 10 may include one or more device structures that are formed on the semiconductor substrate 10.

Referring to step S13 in FIG. 1 and as illustrated in FIG. 4, a first dielectric layer 11 can be formed on the semiconductor substrate 10. The first dielectric layer 11 can include a buffer layer 12 that is formed inside of the first dielectric layer 11.

A combination of the semiconductor substrate 10, the first dielectric layer 11, and the buffer layer 12 can constitute base structure 1.

In some embodiments, a material of the buffer layer 12 may be metallic copper. In some other embodiments, a material of the buffer layer 12 may be any other suitable conductive materials, such as aluminum, etc.

Referring to step S14 in FIG. 1 and as illustrated in FIG. 4, a second dielectric layer 13 can be formed on the base structure 1. The second dielectric layer 13 can cover the first dielectric layer 11 and the buffer layer 12.

A material of the second dielectric layer 13 may be silicon oxide, silicon nitride, or silicon carbon nitride. In some other embodiments, the second dielectric layer 13 can be made of a low-K dielectric material having a dielectric constant between 2.0 to 3.0, such as Black Diamond (BDII: SiOCH). A thickness of the Black Diamond (BDII: SiOCH) can be in a range from 1500 Å to 3000 Å.

The second dielectric layer 13 can be formed by using a physical vapor deposition (PVD) process. In some other embodiments, the second dielectric layer 13 may be formed by using any other suitable process, such as a chemical vapor deposition (CVD) process.

Referring to step S15 in FIG. 1 and as illustrated in FIG. 4, a through hole 14 can be formed in the second dielectric layer 13. The through hole 14 can be formed by using a damascene process. The through hole 14 can penetrate through the second dielectric layer 13 to expose the surface of the buffer layer 12. An opening width of the through hole 14 can be in a range from 30 nm to 100 nm. A depth of the through hole 14 can be in a range from 100 nm to 300 nm.

In some embodiments, before performing a roughening treatment towards the buffer layer 12, a cleaning process can be performed to the surface the buffer layer 12 to remove by-products that are generated on the surface of the buffer layer 12 during the process for forming the through hole.

Referring to step S17 in FIG. 1, the bottom of the through hole 14 can be washed firstly. Specifically, when the buffer layer 12 contains metal copper, during the etching process for forming the through hole 14, the etching agent can interact with the surface of the buffer layer 12 to generate by-products including $CuF_2$, CuN, CuCN, etc. In order to remove the by-products, a cleaning agent can be selected from HF solution, $H_2SO_4$ solution, HCl solution, $HNO_3$ solution, $NH_4OH$ solution, and any suitable combination thereof. In one embodiment, an HF solution can be used as the cleaning agent. In the HF solution, a volume ratio of $H_2O$ and HF can be in a range from 50:1 to 5000:1.

Referring to step S19 in FIG. 1, in order to reduce a binding force between the buffer layer 12 and a barrier layer to be formed subsequently, a roughening treatment can be performed on the surface of the buffer layer 12 to increase the surface roughness of the buffer layer 12. The roughening treatment may be performed by using a wet etching method.

Figure 2:
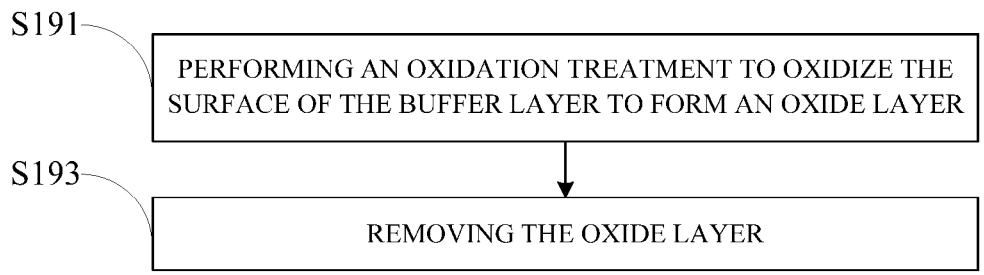
FIG. 2 illustrates a flow chart of an exemplary process for roughening a surface of a buffer layer in accordance with some embodiments of the disclosed subject matter.

Turning to FIG. 2, a flow chart of an exemplary process for roughening a surface of a buffer layer is shown in accordance with some embodiments of the disclosed subject matter.

Figure 5:
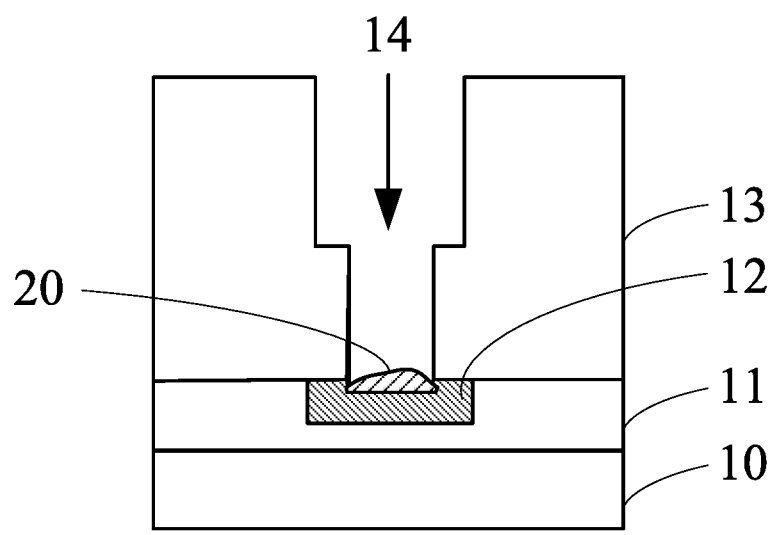
Figure 6:
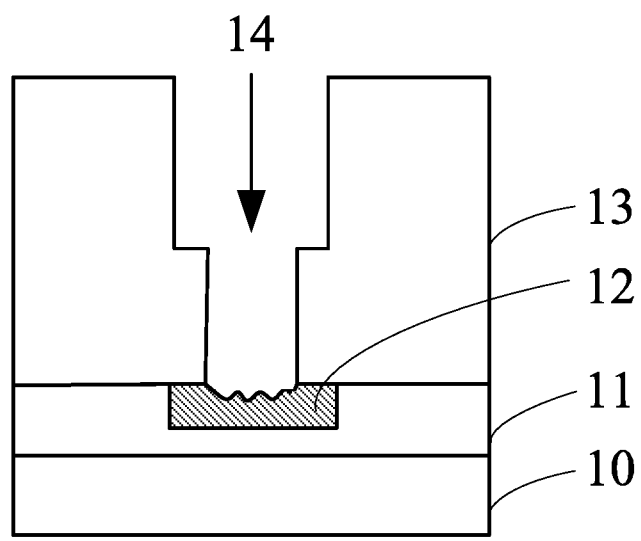

Referring to step S191 in FIG. 2 and as illustrated in FIG. 5, an oxidation treatment can be performed to oxidize the surface of the buffer layer 12 to form an oxide layer 20. In some embodiments, hydrogen peroxide solution can be used to oxidize the surface of the copper buffer layer 12 to form a copper oxide layer 20. In the hydrogen peroxide solution, a volume ratio of $H_2O$ and $H_2O_2$ can be in a range from 5:1 to 10:1. A processing time of the oxidation treatment can be in a range from 5 s to 20 s.

Referring to step S193 in FIG. 2 and as illustrated in FIG. 5, the oxide layer 20 on the surface of the buffer layer 20 can be removed. In some embodiments, a hydrofluoric acid solution can be used to remove the oxide layer 20. In the hydrofluoric acid solution, a volume ratio of $H_2O$ and HF can be in a range from 50:1 to 5000:1. A processing time for applying the hydrofluoric acid solution can be in a range from 5 s to 20 s. In one embodiment, the hydrofluoric acid solution can have a volume ratio of $H_2O$ and HF as 1000:1.

Note that, during a short processing time of the oxidation treatment, the generated copper oxide layer may have an uneven thickness. Therefore, after removing the copper oxide layer, the remained copper metal of the buffer layer 12 may have a rough surface. As such, a bonding force between the copper surface of the buffer layer 12 and the barrier layer to be formed subsequently may be relatively weak. In that case, the subsequently barrier layer deposited on the bottom of the through hole 14 may be easily bombarding out from the buffer layer by, e.g., argon ions.

It also should be noted that, the surface treatment to the buffer layer 12 can further include a roughening process. The roughening process can be an argon ion bombardment process, or a dry etching process.

In the argon ion bombardment process, an argon gas flow rate can be in a range from 4 sccm to 50 sccm. An RF power applied to an RF coil can be in a range from 0.5 KW to 5 KW. An AC bias power applied to a wafer can be in a range from 200 W to 1000 W. A bombardment duration time can be from 2 s to 15 s.

In the dry etching process, $CClF_3$ or $CF_4$ can be used as an etching agent. A duration time of the dry etching process can be from 1 s to 5 s.

Figure 3:
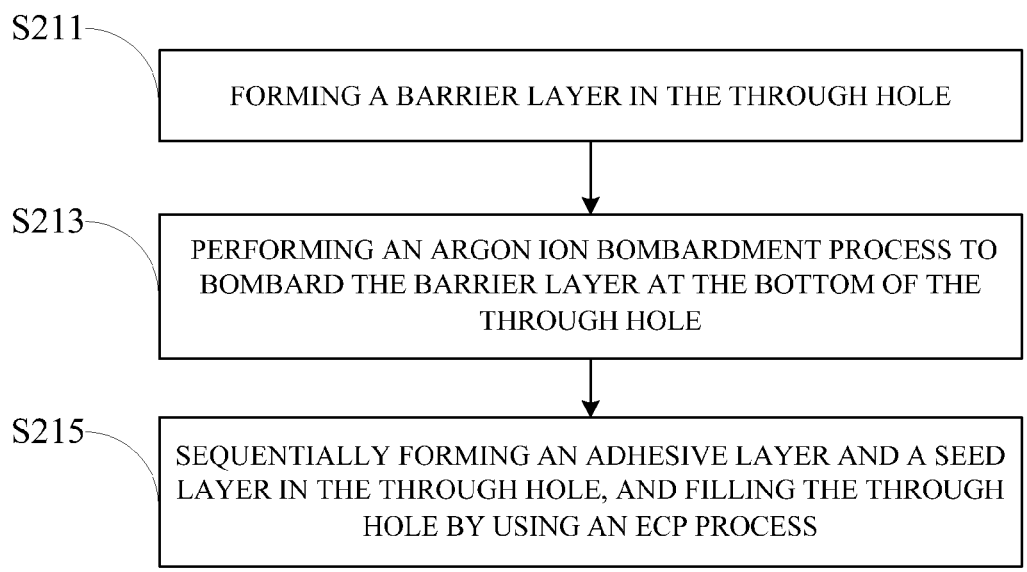
FIG. 3 illustrates a flow chart of an exemplary process for filling a through hole in accordance with some embodiments of the disclosed subject matter.

Turning back to FIG. 1, in step S21, the through hole 14 can be filled. FIG. 3 illustrates a flow chart of an exemplary process for filling a through hole in accordance with some embodiments of the disclosed subject matter.

Figure 7:
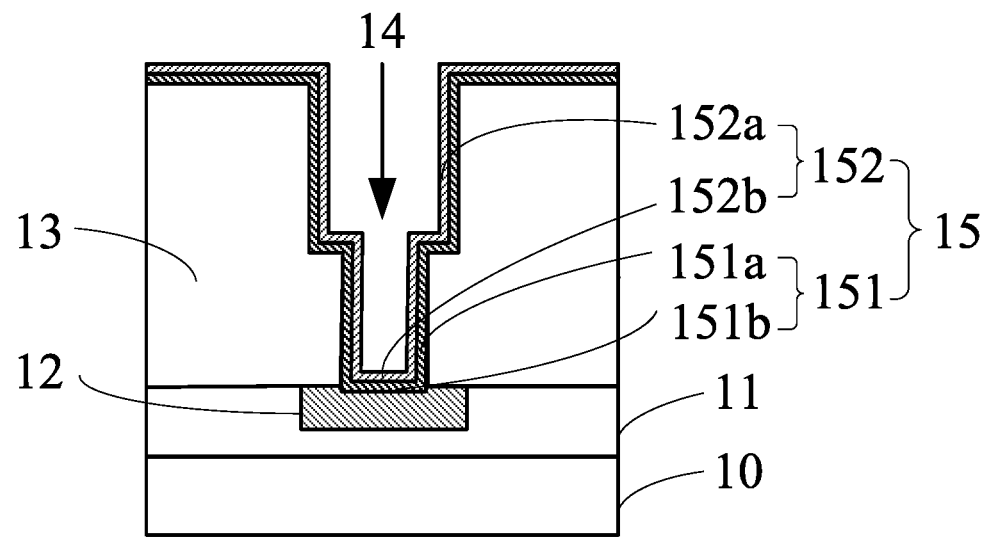

Referring to step S211 in FIG. 3 and as illustrated in FIG. 7, a barrier layer 15 can be formed on the side walls and the bottom of the through hole 14. The barrier layer 15 can be used to prevent the diffusion of the metal atoms of the conductive material that is to be filled into the through hole subsequently. Without the barrier layer 15, the metal atoms of the conductive material can diffuse into the base structure 10, the first dielectric layer 11, and the second dielectric layer 13.

Specifically, the barrier layer 15 can include a first barrier layer 151 and a second barrier layer 152 located on the first barrier layer 151. The first barrier layer 151 includes one portion 151a on the side walls of the through hole 14, and another portion 151b on the bottom of the through hole 14. The second barrier layer 152 includes one portion 152a on the side walls of the through hole 14, and another portion 152b on the bottom of the through hole 14. In some embodiments, a material of the first barrier 151 can be tantalum nitride, and a material of the second barrier layer 152 can be tantalum.

A process for forming the barrier layer 15 can include forming the first barrier layer 151 on the side walls and the bottom of the through hole 14, and then form the second barrier layers 152 on the first barrier layer 151.

In some embodiments, a physical vapor deposition (PVD) process can be used for forming the first barrier layer 151 and the second barrier layer 152.

During the deposition process for forming the first barrier layer 151, a nitrogen flow rate can be from 18 sccm to 30 sccm, an argon gas flow rate can be from 4 sccm to 20 sccm, a DC power of the physical bombardment can be from 10 KW to 30 KW, and an AC bias power applied to the wafer can be from 100 W to 1000 W.

During the deposition process for forming the second barrier layer 152, an argon gas flow rate can be from 4 sccm to 20 sccm, a DC power of the physical bombardment cam be from 10 KW to 30 KW, and an AC bias power applied to the wafer can be from 100 W to 1000 W.

The thickness of each of the formed first barrier layer 151 and the second barrier layer 152 can be in the range from 20 Å to 50 Å.

Note that, the thicknesses of the portion 151b of the first barrier layer 151 (e.g., tantalum nitride layer) and the portion 152b of the second barrier layer 152 (e.g., tantalum layer) at the bottom of the through hole 14 are the key factors to impact the resistance of the contact via to be form.

In order to improve the step coverage of the tantalum nitride and the tantalum and reduce the thickness of the portion 151b of the first barrier layer 151 and the portion 152b of the second barrier layer 152 at the bottom of the through hole 14, a bias deposition process can be performed in some embodiments. That is, during the deposition processes to form the first barrier layer 151 and the second barrier layer 152, a bias with a certain power can be applied to the wafer.

Specifically, a bias power can be from 100 W to 1000 W, an argon gas flow rate can be from 4 sccm to 20 sccm, and a DC voltage power applied to the target can be from 10 KW to 30 KW.

As such, when the barrier layer 15 is deposited, a portion of the barrier layer 15 that has been deposited at the bottom of the though hole 14 can be bombarded by the subsequent tantalum nitride/tantalum atoms up towards the side walls of the through hole 14.

Since the surface of the buffer layer 12 has been roughened, a binding force between the buffer layer 12 and the barrier layer 15 can be relatively weak. Therefore, the portion of the barrier layer 15 deposited at the bottom of the though hole 14 can be bombarded out more easily. Thus, the thickness of the portion 151b of the first barrier layer 151 and the portion 152b of the second barrier layer 152 at the bottom of the through hole 14 can be further reduced. In the meantime, a coverage rate of the portion 151a of the first barrier layer 151 and the portion 152a of the second barrier layer 152 on the side walls of the through hole 14 can be improved.

Figure 8:
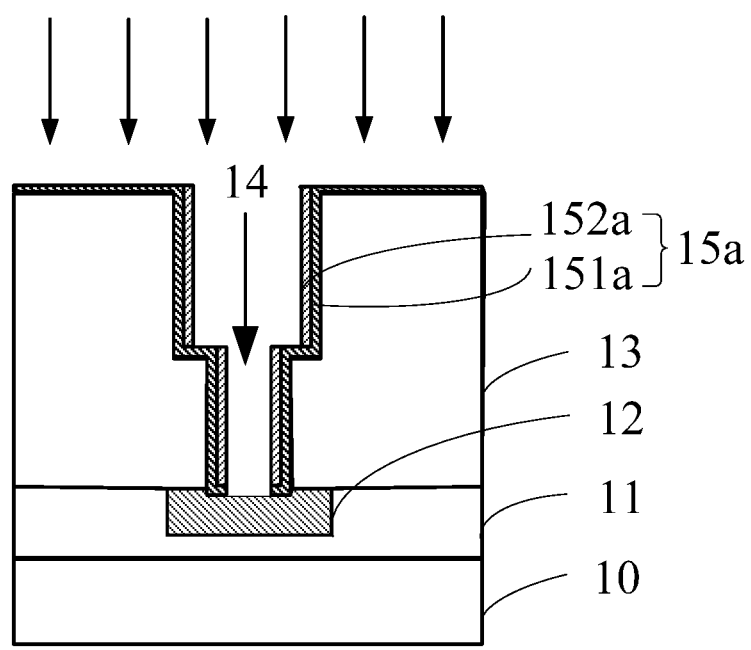

Referring to step S213 in FIG. 3 and as illustrated in FIG. 8, to reduce the thickness of the portion 151b of the first barrier layer 151 and the portion 152b of the second barrier layer 152 at the bottom of the through hole 14, argon ions can be used to bombard the barrier layer 15 at the bottom of the through hole 14.

In some embodiments, during the argon ion bombardment process, an argon gas flow rate can be from 5 sccm to 50 sccm. A radio frequency (RF) coil can be installed in the process chamber, and an RF power applied to the RF coil can be from 10 kW to 30 kW to ionize the argon gas. An AC power applied on the wafer can be from 500 W to 1000 W to accelerate the argon ions. A duration time of the bombardment process can be from 2 s to 15 s.

As described above, since a bonding force between the barrier layer 15 and the buffer layer 12 is relatively small, a relatively low power used in the argon ion bombardment process is able to remove a relatively large amount of the barrier layer 15 at the bottom of the through holes 14. That is, the improved bombardment efficiency can avoid using a high power in the argon ion bombardment. Therefore, it can be ensured that the damages to the first dielectric layer 11 and second dielectric layer 13 can be eliminated during the argon ion bombardment process.

Referring to step S215 in FIG. 3, an adhesive layer and a seed layer can be sequentially formed in the through hole 14, and the through hole 14 can be filled by using an electro chemical plating (ECP) process.

Figure 9:
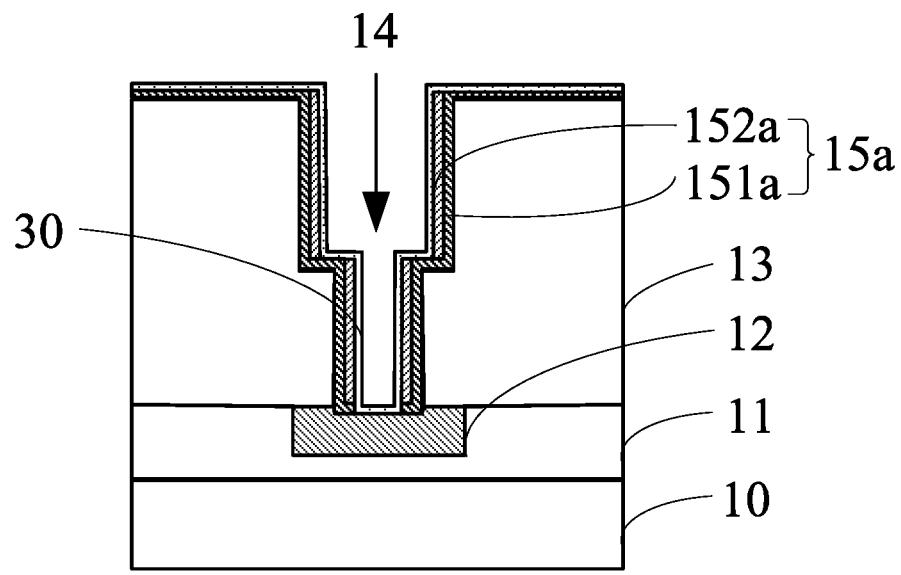

Turning to FIG. 9, an adhesive layer 30 can be formed in the through hole 14. The adhesive layer 30 can be used to ensure a continuous growth of the seed layer to be formed subsequently. In some embodiments, a material of the adhesive material layer 30 may be tantalum, titanium, or any other suitable material. The adhesive layer 30 can be formed by using a physical vapor deposition (PVD) process. During the deposition process, a DC power of the physical bombardment can be from 10 KW to 30 KW, and AC bias power applied to the wafer can be from 100 W to 1000 W. In some other embodiments, the adhesive layer 30 may be formed by using a chemical vapor deposition (CVD) process, an atomic layer deposition (ALD) process, etc. A thickness of the adhesive layer 30 can be from 10 Å to 30 Å.

Figure 10:
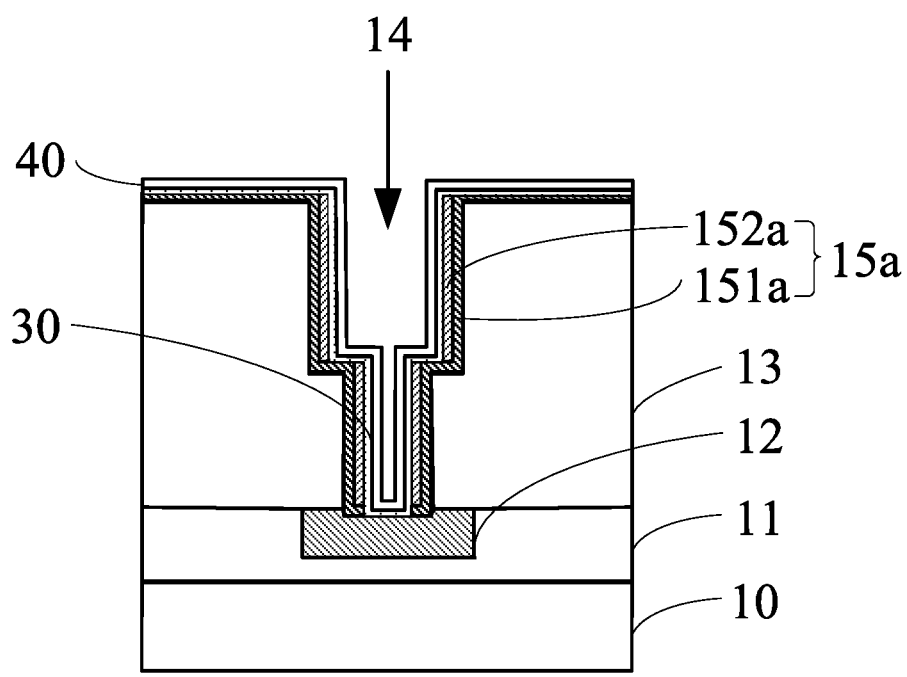

Turning to FIG. 10, a seed layer 40 can be formed in the through hole 14. A material of the seed layer 40 is related to the filling material used in the subsequent filling process. In one embodiment, metal copper is used for the wire material, and the seed layer 40 is also made of copper. The copper seed layer can be formed by using a physical vapor deposition (PVD) process. A DC power applied to the target can be from 10 KW to 50 KW. A thickness of the copper seed layer can be from 200 Å to 800 Å.

Figure 11:
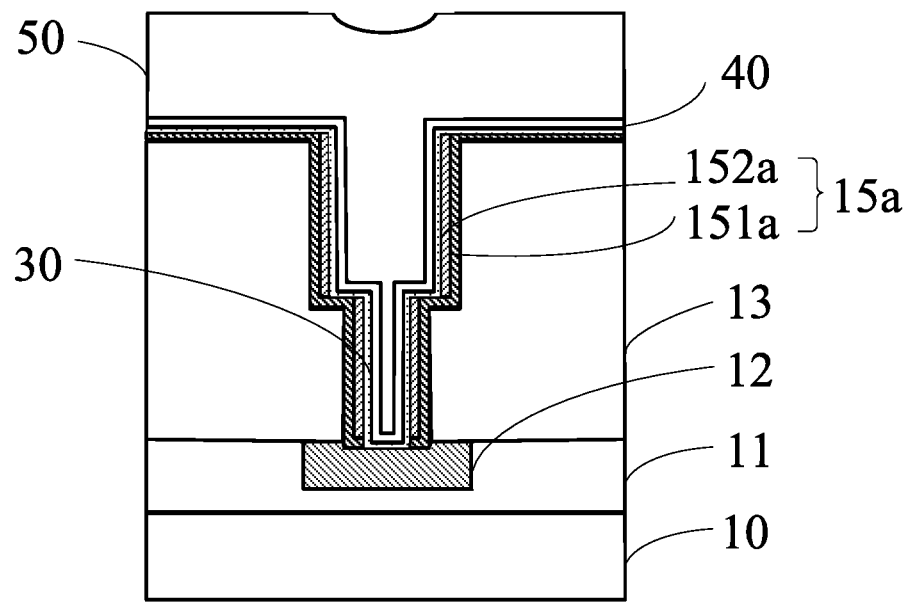
Figure 12:
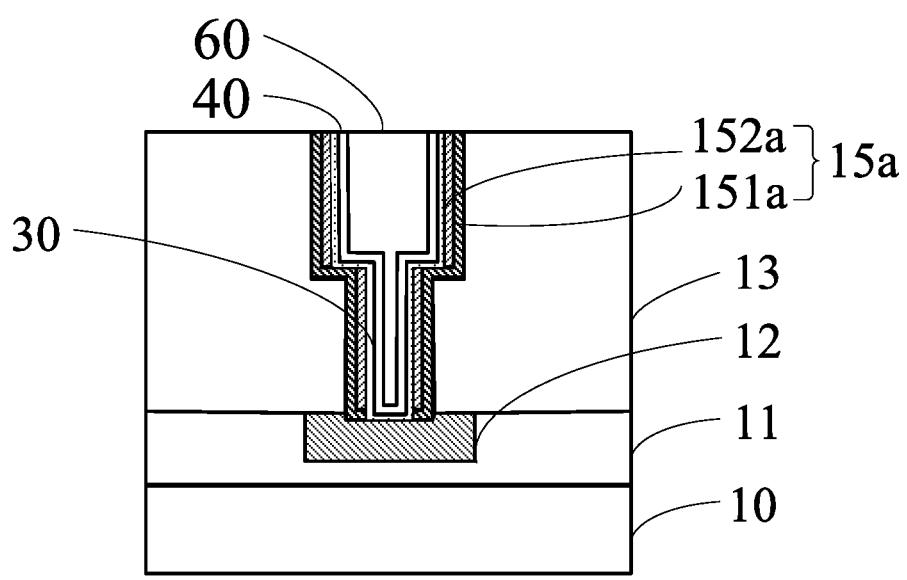

Turning to FIG. 11, a filling process can be performed to fill conductive material 50 into the through hole 14. The conductive material 50 can be selected from tungsten, aluminum, silver, chromium, molybdenum, nickel, palladium, platinum, titanium, tantalum, copper, or any suitable combination thereof. In one embodiment, the conductive material 50 is copper. Specifically, the filling process to fill conductive material 50 into the through hole 14 can be realized by using an electro chemical plating (ECP) process.

Referring back to step S23 of FIG. 1 and as illustrated in 12, after the filling process, a planarization process can be performed to planarize the top surface of the filled through hole 14. Specifically, a chemical mechanical polishing (CMP) process can be used to planarize the top surface of the filled through hole 14 to form a contact via 60.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a contact via structure and a fabricating method thereof are provided. In the disclosed fabricating method, a roughening treatment can be performed to the surface of the buffer layer before forming the barrier layer, such that the binding force between the barrier layer and the buffer layer at the bottom of the through hole becomes weaker, which may facilitate to use an argon ion bombardment process to reduce the thickness of the barrier layer on the surface of the buffer layer. Therefore, the improved bombardment efficiency can avoid using a high power in the argon ion bombardment to eliminate the damages to the dielectric layer during the argon ion bombardment process. That is, under the premise of reliability, the resistance of the contact via can be effectively reduced.

In the disclosed contact via structure, a buffer layer is inside of a substrate, a dielectric layer can cover the substrate and the buffer layer, and a through hole is in the dielectric layer. A surface of the buffer layer at the bottom of the through hole is a roughened surface. A barrier layer is in the through hole, a thickness of one portion of the barrier layer at the bottom of the through hole is less than a thickness of another portion of the barrier layer on the sidewalls of the through hole. An adhesive layer is on the barrier layer in the through hole, and a seed layer on the adhesive layer in the through hole. A conductive material filled in the through hole. Since the disclosed contact via structure has a thickness reduced barrier layer on the bottom of the through hole, the resistance of the contact via can be effectively reduced.

Although the disclosed subject matter has been described and illustrated in the foregoing illustrative embodiments, it is understood that one disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of one disclosure.

What is claimed is:

1. A method for fabricating a contact via structure, comprising:
   providing a substrate;
   forming a buffer layer in the substrate;
   forming a dielectric layer covering the substrate and the buffer layer;

forming a through hole in the dielectric layer, wherein a bottom of the through hole exposes a surface of the buffer layer;

performing a roughening treatment to the exposed surface of the buffer layer to increase a roughness of the exposed surface of the buffer layer, wherein the roughening treatment comprises:

performing an oxidization process to the exposed surface of the buffer layer to form an oxidized layer, the oxidized layer has an uneven thickness; and filling a conductive material into the through hole to form a contact via.

2. The method of claim 1, wherein the roughening treatment comprises:

removing the oxidized layer.

3. The method of claim 2, wherein the oxidization process comprises:

using a hydrogen peroxide solution to oxidize the exposed surface of the buffer layer, wherein:

a volume ratio of $H_2O$ and $H_2O_2$ in the hydrogen peroxide solution is in a range from 5:1 to 10:1; and a duration time of the oxidation process is in a range from 5 s to 20 s.

4. The method of claim 2, wherein removing the oxidized layer comprises:

using a hydrofluoric acid solution to remove the oxide layer, wherein:

a volume ratio of $H_2O$ and HF in the hydrofluoric acid solution is in a range from 50:1 to 5000:1; and a processing time of to apply the hydrofluoric acid solution is in a range from 5 s to 20 s.

5. The method of claim 1, wherein the roughening treatment comprises:

performing an argon ion bombardment process to roughen the exposed surface of the buffer layer.

6. The method of claim 1, wherein the roughening treatment comprises:

performing a dry etching process to roughen the exposed surface of the buffer layer.

7. The method of claim 6, wherein the dry etching process comprises:

using $CClF_3$ or $CF_4$ as an etching agent having a duration time of the dry etching process in a range from 1 s to 5 s.

8. The method of claim 1, further comprising:

before performing the roughening treatment, performing a cleaning process to remove by-products on the exposed surface of the buffer layer.

9. The method of claim 8, wherein:

a cleaning agent of the cleaning process is selected from HF solution, $H_2SO_4$ solution, HCl solution, $HNO_3$ solution, $NH_4OH$ solution, and a combination thereof.

10. The method of claim 8, wherein:

a cleaning agent of the cleaning process is HF solution; and a volume ratio of $H_2O$ and HF in the HF solution is in a range from 50:1 to 5000:1.

11. The method of claim 1, further comprising:

after performing the roughening treatment, forming a barrier layer in the through hole.

12. The method of claim 11, wherein forming the barrier layer comprises:

reducing a thickness of a portion of the barrier layer at the bottom of the through hole.

13. The method of claim 12, wherein reducing the thickness of the portion of the barrier layer at the bottom of the through hole comprises:

performing an argon ion bombardment process to bombard the barrier layer at the bottom of the through hole;

wherein an argon gas flow rate is in a range from 5 sccm to 50 sccm;

an RF power applied on a RF coil is in a range from 10 kW to 30 kW to ionize the argon gas;

an AC power applied on a wafer is in a range from 500 W to 1000 W to accelerate the argon ions; and a duration time of the argon ion bombardment process is in a range from 2 s to 15 s.

14. The method of claim 11, further comprising:

before filling the through hole, sequentially forming an adhesive layer and a seed layer on the barrier layer in the through hole; and after filling the through hole, performing a planarization process to planarize the top surface of the contact via.

15. A method for fabricating a contact via structure, comprising:

providing a substrate;

forming a buffer layer in the substrate;

forming a dielectric layer covering the substrate and the buffer layer;

forming a through hole in the dielectric layer, wherein a bottom of the through hole exposes a surface of the buffer layer;

performing a roughening treatment to the exposed surface of the buffer layer to increase a roughness of the exposed surface of the buffer layer, wherein the roughening treatment comprises:

performing an argon ion bombardment process to roughen the exposed surface of the buffer layer, wherein the argon ion bombardment process comprises:

an argon gas flow rate in a range from 4 sccm to 50 sccm;

a radio frequency (RF) power applied to an RF coil in a range from 0.5 KW to 5 KW;

an alternating current (AC) bias power applied to a wafer in a range from 200 W to 1000 W; and a duration time of the argon ion bombardment process in a range from 2 s to 15 s; and filling a conductive material into the through hole to form a contact via.

16. The method of claim 15, wherein the roughening treatment comprises:

performing an oxidization process to the exposed surface of the buffer layer to form an oxidized layer; and removing the oxidized layer.

17. The method of claim 16, wherein the oxidization process comprises:

using a hydrogen peroxide solution to oxidize the exposed surface of the buffer layer, wherein:

a volume ratio of $H_2O$ and $H_2O_2$ in the hydrogen peroxide solution is in a range from 5:1 to 10:1; and a duration time of the oxidation process is in a range from 5 s to 20 s.

18. A method for fabricating a contact via structure, comprising:

providing a substrate;

forming a buffer layer in the substrate;

forming a dielectric layer covering the substrate and the buffer layer;

forming a through hole in the dielectric layer, wherein a bottom of the through hole exposes a surface of the buffer layer;

performing a roughening treatment to the exposed surface of the buffer layer to increase a roughness of the exposed surface of the buffer layer;

after performing the roughening treatment, forming a barrier layer in the through hole, wherein forming the barrier layer comprises:

using two physical vapor deposition (PVD) processes to form a tantalum nitride layer and a tantalum layer, wherein in each PVD process, a nitrogen flow rate is from 18 sccm to 30 sccm, an argon gas flow rate is from 4 sccm to 20 sccm, a DC power of physical bombardment is from 10 KW to 30 KW, and an AC bias power applied to a wafer is from 100 W to 1000 W; and filling a conductive material into the through hole to form a contact via.

19. The method of claim 18, wherein the roughening treatment comprises:

performing an oxidization process to the exposed surface of the buffer layer to form an oxidized layer; and removing the oxidized layer.

20. The method of claim 19, wherein the oxidization process comprises:

using a hydrogen peroxide solution to oxidize the exposed surface of the buffer layer, wherein:

a volume ratio of $H_2O$ and $H_2O_2$ in the hydrogen peroxide solution is in a range from 5:1 to 10:1; and a duration time of the oxidation process is in a range from 5 s to 20 s.

\* \* \* \* \*